Figure 1:
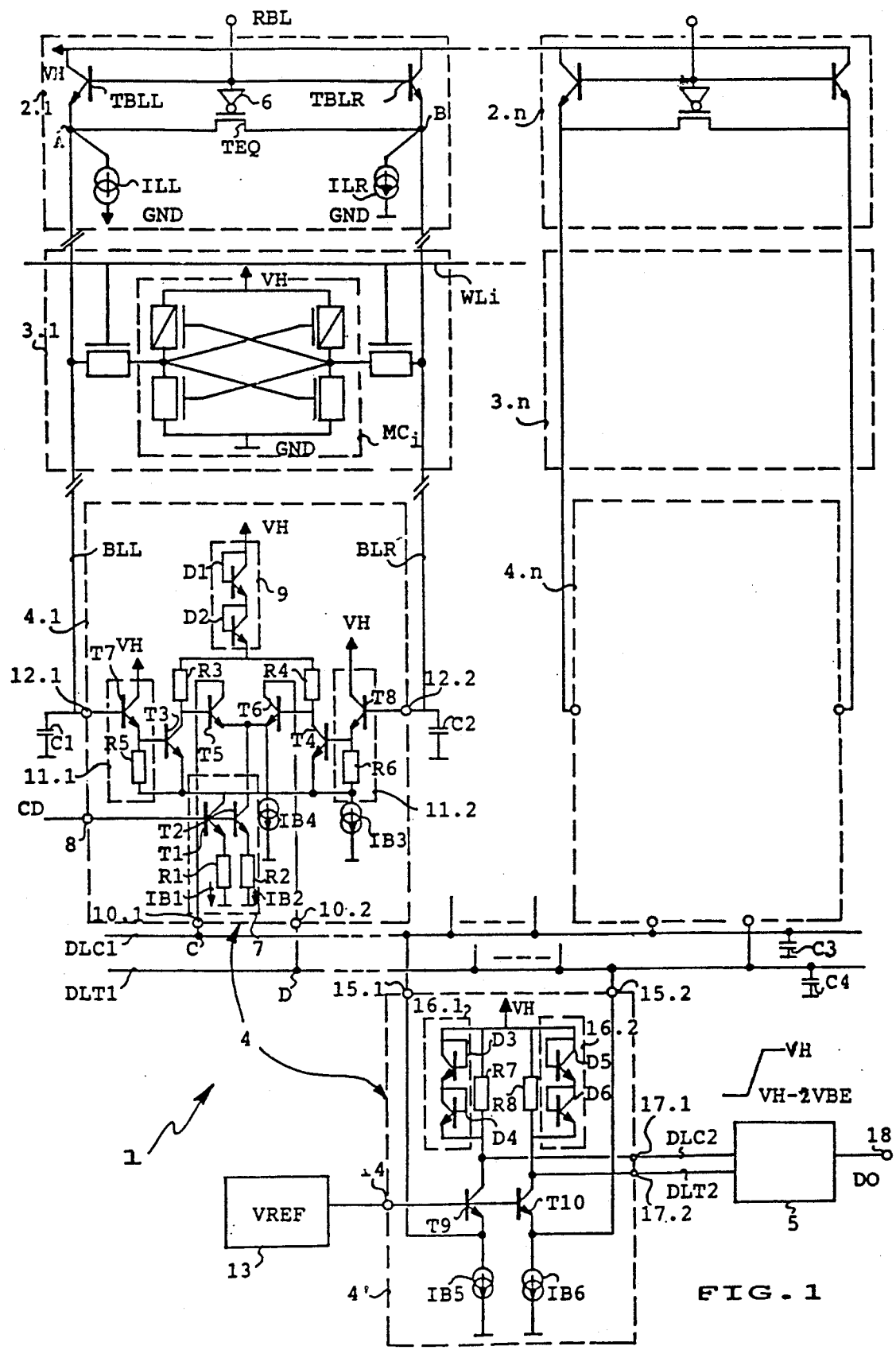

United States Patent [19]

Leforestier et al.

[11] Patent Number: 5,172,340

[45] Date of Patent: Dec. 15, 1992

[54] DOUBLE STAGE BIPOLAR SENSE AMPLIFIER FOR BICMOS SRAMS WITH A COMMON BASE AMPLIFIER IN THE FINAL STAGE

[75] Inventors: Sylvain Leforestier, Le Chenay; Dominique Omet, Evry, both of France

[73] Assignee: International Business Machines Corporation, Armonk, N.Y.

[21] Appl. No.: 714,319

[22] Filed: Jun. 10, 1991

Related U.S. Application Data

[63] Continuation of Ser. No. 420,964, Oct. 13, 1989, abandoned.

[30] Foreign Application Priority Data

Oct. 28, 1988 [EP]  European Pat. Off. ............ 88480066

[51] Int. Cl.$^5$ ..................... G11C 7/06; G11C 11/40; G11C 11/407
[52] U.S. Cl. .................... 365/207; 365/177; 365/179; 365/189.05; 365/189.09; 365/208; 365/225.6; 307/530
[58] Field of Search ............... 365/190, 205, 207, 208, 365/177, 179, 189.05, 225.6, 189.09; 307/355, 530, 495, 544, 570

[56] References Cited

U.S. PATENT DOCUMENTS

| | | | |
|---|---|---|---|
| 4,027,176 | 5/1977 | Heuber et al. | 307/530 |
| 4,313,179 | 1/1982 | Heimeier et al. | 365/154 |
| 4,553,053 | 11/1985 | Ong et al. | 307/530 |
| 4,853,899 | 8/1989 | Kitsukawa et al. | 365/207 |
| 4,984,196 | 1/1991 | Tran et al. | 365/207 |
| 4,984,204 | 1/1991 | Sato et al. | 365/208 |
| 5,023,841 | 6/1991 | Akrout et al. | 365/207 |

FOREIGN PATENT DOCUMENTS

| | | | |
|---|---|---|---|
| 055409 | 7/1982 | European Pat. Off. | |
| 0025303 | 3/1981 | United Kingdom | 365/207 |

OTHER PUBLICATIONS

"A 12ns 256K BiCMOS SRAM" by R. A. Kertis et al., ISSCC 88, pp. 186-187.
IEEE J. of Solid-State Circuits, Vo. SC-19, No. 15, pp. 557-563, Oct. 1984, J.-I. Miyamotto et al., "A High-Speed 64K CMOS RAM with Bipolar Sense Amplifiers."

Primary Examiner—Joseph L. Dixon
Assistant Examiner—Jack A. Lane
Attorney, Agent, or Firm—Donald M. Boles; Eric W. Petraske

[57] ABSTRACT

There is described a double stage sense amplifier (4) in bipolar technology achieving very high speed operation without saturation or connection problems. For each memory cell column of the computer member system (1), a first stage or column sense stage (4.1) amplifies the differential input signal (V) produced on the pair of bit lines (BLL, BLR) according to the information read from one CMOS memory cell of the memory cell array (3.1) to provide a first differential output signal (V1) available at output terminals (10.1, 10.2). The output terminals of all the first stage (4.1 to 4.n) are connected to a first-data out bus comprised of the data lines (DLC1, DLT1). A second stage or final stage (4') amplifies the first differential output signal developed on the data lines to provide a second differential output signal (V2) at output terminals (17.1, 17.2). The second stage of the common base amplifier type is comprised of two transistors (T9, T10). The base electrodes of these transistors are connected to a reference voltage generator (13) which supplies a reference voltage VREF such as VREF=VH−1.5 VBE. This special value greatly helps both first and second stages not to saturate and in addition, minimizes the sensibility of the sense amplifier to the connection of additional memory cell columns on the data lines (DLC1, DLT1). Both stages are provided with various antisaturation circuits (9, 11.1; 11.2, 16.1, 16.2) which cooperate with the reference voltage generator to keep any transistor far from saturation.

7 Claims, 2 Drawing Sheets

DOUBLE STAGE BIPOLAR SENSE AMPLIFIER FOR BICMOS SRAMS WITH A COMMON BASE AMPLIFIER IN THE FINAL STAGE

This application is a continuation of application Ser. No. 07/420,964 filed Oct. 13, 1989, now abandoned.

This invention relates to sense amplifiers in bipolar technology for SRAMs (Static Random Access Memories) and more particularly to a double stage sense amplifier with a common base amplifier in the final stage, appropriate to the sensing of memory cells made of MOS FETs (Metal Oxide Semiconductor Field Effect Transistors) of either N type (NMOS) or of the complementary type (CMOS).

CMOS device manufacturing methods have many compatible processing steps that are compatible with bipolar device manufacturing methods. Recently, new methods have been developed to implement both CMOS and bipolar devices on the same chip to take benefit of their respective advantages, leading to the so called BICMOS technology.

In the BICMOS technology, the combination of low power consumption, high density CMOS memory cells with double stage sense amplifiers comprised of fast high current gain bipolar transistors, allows reaching an excellent compromise between density and speed in high performance and cost competitive memories.

The use of SRAM cells in CMOS technology presents many advantages in terms of density which leads to highly integrated memory chips but also in terms of manufacturing yields.

In addition to their high speed, bipolar devices have a number of intrinsic advantages compared to CMOS devices when used in certain applications, such as in SRAM sense amplifiers. In particular, bipolar devices are appreciated for their outstanding driving capability of capacitive loads due to their high current gain. As a result, during transient periods, bipolar devices allow faster charging and discharging capacitive loads which in turn, result in a significant decrease of delays. Also, bipolar devices require smaller transitions on signal swings than CMOS devices. However, extensive usage of bipolar devices has been limited because of their large power dissipation.

On the other hand, double stage sense amplifiers have taken a definite advantage over single stage sense amplifier in CMOS SRAMs sensing schemes, particularly in terms of speed and sensing accuracy. In addition, it allows more flexibility to the circuit designer.

A typical example of a fully bipolar double stage sense amplifier is depicted in the proceedings of the ISSCC88 pages 186–187, in an article entitled: A 12 ns 256 K BICMOS SRAM by R. A. Kertis et al. This document is thereafter referred to as Ref.1. Now turning more particularly to its FIG. 5, there is described a double stage sense amplifier in bipolar technology, which obviously aims at reaching a high speed operation. Each column of the memory cell array is sensed by a column sense amplifier (first stage). The differential input signal V developed across the bit lines of the selected memory cell column is applied to the input terminals of this first stage sense amplifier, which is of the single stage differential amplifier type. This differential input signal is representative of the binary data stored in the selected memory cell.

All pairs (e.g. 128 pairs) of the output terminals of the first stage supplying the differential output signals are connected in parallel on the data lines to drive the second or final stage of the sense amplifier. The final stage is also of the single stage differential amplifier type. The sensing scheme is thus achieved through two successive amplifications, first in the column sense amplifier, then in the final stage. The differential output signal generated by the first stage is applied on the base electrodes of two transistors mounted in an emitter-follower configuration which in turn, drive the emitter coupled differential amplifier of the final stage. Each of these transistors is provided with a PN diode across the collector-base junction (these diodes are obtained by shorting the collector-base junction of transistors Q1 and Q2). Transistors Q1 and Q2 are the loads of the first stage. This construction is also an attempt to avoid saturation of said emitter-follower in reducing the voltage signal swing on the collectors of Q1 and Q2. The output terminals of the final stage are connected to a standard output buffer. It is important to notice that both first and second stages of the sense amplifier are internally connected in a single stage differential amplifier configuration.

The circuit disclosed in Ref. 1 has a number of inconveniences which are listed thereafter:

there is an excessive sensitivity to the multiple columns connected to the data lines. The voltages at these lines must be moved by a minimum value sufficient for a reliable and valid detection operation;

there is a neglectible voltage amplification produced by the first stage which has only a single differential amplifier stage, because differential signal amplification results of the small difference between the base-emitter voltage VBE of transistors Q1 and Q2, approximately less than 60 mv. Should the amplification be increased, there would be a potential risk of saturation of bipolar transistors of both stages in the absence of Schottky Barrier Diodes connected in parallel with the collector-base junction of said transistors. Unfortunately, it is well known to those skilled in the art, that only Schottky Barrier Diodes (SBD's) having an appropriate forward voltage VF, in the range of 0,6V can efficiently avoid saturation when properly connected across the collector-base junction. Unfortunately, fabrication of these SBDs needs complex processing steps with high temperature deposition metals such as titanium. Implementing these steps, lowers manufacturing yields which in turn, results in a significant increase of the costs of manufactured products;

the current supplied by the column decoder circuit (so called group decode in FIG. 5) to the first stage, then to the second stage through transistors Q1 and Q2, is derived from a NFET. This implementation does not track particularly well with the base emitter voltage VBE of bipolar transistors Q1 and Q2.

Therefore, it is a primary object of the present invention to provide a fully bipolar double stage sense amplifier for a computer memory system having a common base amplifier in the final or second stage for minimizing sensibility to the connection of additional memory columns on the data lines.

It is another object of the present invention to provide a fully bipolar double stage sense amplifier for a computer memory system having a double stage differential amplifier in the first stage for maximum amplification of the differential input signal developed across the bit lines.

It is another object of the present invention to provide a fully bipolar double stage sense amplifier for a computer memory system wherein first and second stages include antisaturation features for a high speed READ operation without usage of SBD's.

It is still another object of the present invention to provide a fully bipolar double stage sense amplifier for a computer memory system including column decoder means comprised of bipolar transistors for fast column DECODE operation.

These and other object of the present invention are accomplished by a double stage sense amplifier for a computer memory system of the kind including: a plurality (n) of memory cell columns, each memory cell column including or being associated with a restore circuit, a MOSFET memory cell array and a first sense amplifier means connected between the pair of bit lines of that memory cell column; said first sense amplifier means is of the differential type having input terminals adapted to receive the differential input signal (V) developed across said bit lines and output terminals adapted to transmit a first differential output signal (V1) on a pair of data lines; a second sense amplifier means having input terminals adapted to receive the first differential output signal (V1) and output terminals adapted to transmit a second differential output signal (V2) generated in response to the first differential output signal on a pair of data out lines to an output buffer; said double stage sense amplifier being characterized in that said second sense amplifier means includes a common base amplifier means connected to a reference voltage generator which supplies a reference voltage VREF of a special value, so that said first differential output signal (V1) is substantially constant, whatever, the number n of memory cell columns connected to said data lines.

In combination with the implementation of a common base amplifier in the second sense amplifier means, both first and second sense amplifier means are provided with antisaturation means for very high speed operation when a memory cell is read, so that the data is transferred without delay penalty from them memory cell to said output buffer. Said antisaturation means does not involve usage of SBD's.

The novel features believed to be characteristic of this invention are set forth in the appended claims. The invention itself, however, as well as other objects and advantages thereof, may best be understood by reference to the following detailed description of an illustrated preferred embodiment, read in conjunction with the accompanying drawings in which:

FIG. 1 shows the schematic representation of a computer memory system organization including the double stage sense amplifier of the present invention.

Figure 2:
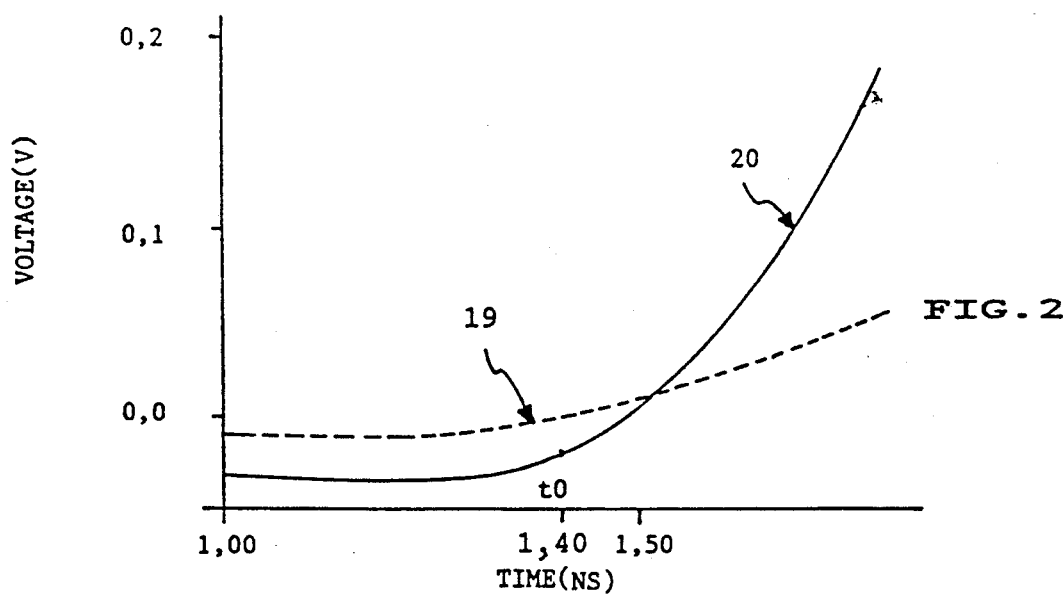
Figure 3:
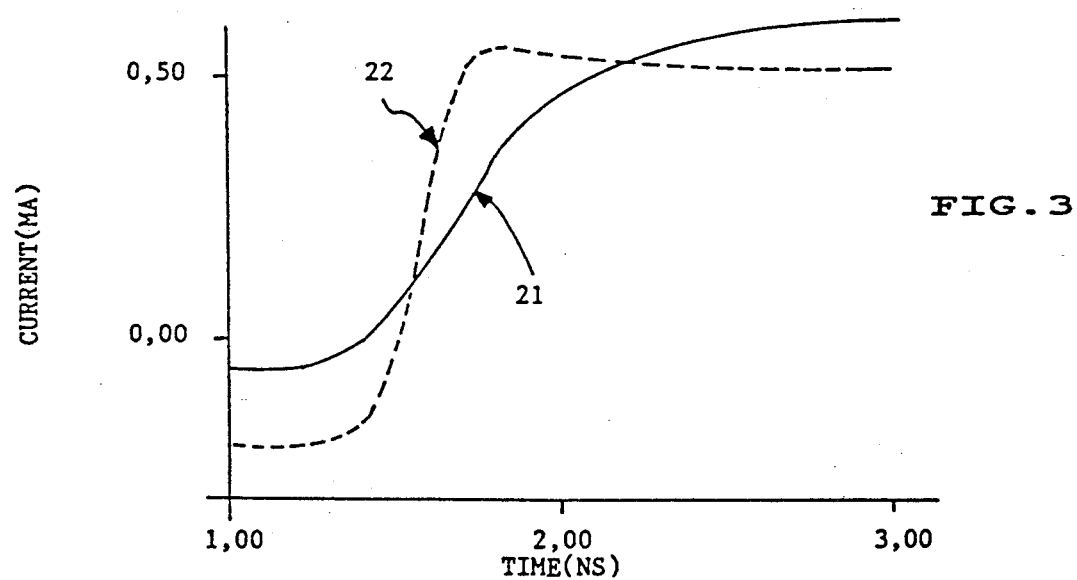

FIGS. 2 and 3 respectively illustrate typical differential voltages and currents in the first stage of the sense amplifier during a READ operation.

Figure 4:
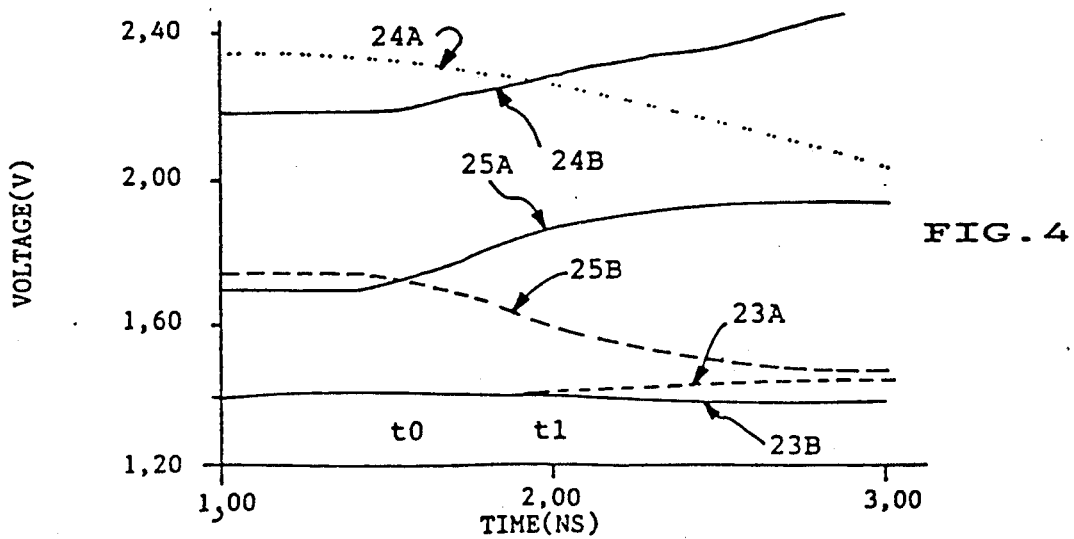

FIG. 4 illustrates typical signal waveforms in the data path of the double stage sense amplifier during a READ operation.

FIG. 1 basically shows the typical organization of an advanced computer memory system bearing numeral 1 which includes the double stage sense amplifier of the present invention. For memory cell column 1, which has been selected for illustration purposes, the circuitry is comprised of three elementary circuit blocks: a restore circuit, a memory cell array (only one memory cell is shown) and a column sense amplifier stage, respectively referenced 2.1, 3.1, and 4.1. The output terminals of the column sense amplifier 4.1 are connected to a first data out bus comprised of data lines DLC1 and DLT1 according to the usual terminology. The final sense amplifier stage common to all columns is represented by an additional circuit block referenced 4' in FIG. 1. Basically, the double stage sense amplifier 4 of the present invention is therefore comprised of a first stage consisting of a column sense amplifier stage, e.g. 4.1, and of a second stage 4', consisting of said final sense amplifier stage; both stages are connected in cascade, with the first data out bus coupled therebetween. The final stage 4' is connected through a second data out bus comprised of data out lines DLC2 and DLT2 to an output buffer 5, e.g. a D type flip flop, to latch the data. It should be recognized that additional columns may be also coupled to that first data out bus, so that the final sense amplifier can service more than one memory cell column. The amount n of columns may vary depending on the technology used, the memory size, and its organization. Here, up to n=32 columns may be easily connected to the represented first data out bus consisting of data lines DLT1, and DLC1. This number n which represents the multiple connection capabilities of the circuit is limited by the speed of the final stage sense amplifier. All these constituting blocks will now be described in details.

CIRCUIT DESCRIPTION

The Restore Circuit

Restore circuit 2.1 essentially consists of two NPN transistors TBLL and TBLR, the collector electrodes of which are connected to a first supply voltage: a positive voltage VH. Constant current sources ILL and ILR are used to avoid a poor control on the bit line voltages by limiting coupling noises and collector-emitter pipe effects. Current sources ILL and ILR have controlled leakage currents (5.0 $\mu A$) that are sunk thru degenerated NFET devices (not showing) connected between the respective bit lines BLL and BLR and a second supply voltage: the ground GND. Current sources ILL and ILR are connected to the bit lines respectively at nodes A and B. As a result of this construction, transistors TBLL and TBLR act as two emitter-followers that efficiently restore the left and right bit lines BLL and BLR respectively to VH-VBE at the same time Transistor TEQ is a PFET device used for the bit line voltage equalization. Thanks to this transistor because the first stage sense amplifier operates very close to a zero differential input signal when a READ occurs, transistor TEQ plays a key role in speeding up the memory. Transistor TEQ is controlled by the Restore Bit Line signal RBL which is applied on its gate electrode through CMOS inverter 6. This signal RBL also controls transistors TBLL and TBLR since it is applied on their base electrodes.

The Memory Cell

The memory cell array 3.1 is comprised of a plurality of six transistor memory cells (only one cell is shown). The storage element, e.g. MCi, biased between said first and second supply voltages, VH and GND, comprises four transistors. Memory cells are connected to the bit lines BLL and BLR through a pair of NFET's mounted in a transmission or transfer gate configuration, which operate as gating means. These memory cells are standard and known to allow a low stand-by current when fabricated according to the CMOS technology. The gate electrodes of these FET's are connected to the corresponding word line, e.g. WLi, for READ and WRITE operations. Bit lines BLL and BLR are used as the input (WRITE) or output (READ) path for data movement in and out of the memory cell array.

Those bit lines are very capacitive due to the summation of all diffusion regions such as sources and drains of above mentioned transfer devices and also because long metal wires physically form these bit lines. Resulting capacitances of a column are illustrated in FIG. 1 by capacitors C1 and C2 respectively for BLL and BLR.

The Double Stage Sense Amplifier

Basically, the first stage referenced 4.1 plays the double role of column sense amplifier and column selection.

The role of the first stage is to amplify the small differential input signal created across the bit lines when the content of a storage element of the column, e.g. MCi in column 1, is read. One among the n first stages, e.g. 4.1, is selected when being powered up through the column decoder circuit 7. The Column Decoder signal CD which is applied on terminal 8, simultaneously drives two standard emitter follower current sources comprised of two NPN transistors T1 and T2, each loaded by a resistor, respectively R1 and R2. Respective currents are referenced IB1 and IB2. Each of these current sources feeds a pair of NPN transistors T3/T4 and T5/T6, respectively, to provide the desired voltage amplification of the bit line differential input signal for very high speed and reliable operation.

Both pairs T3/T4 and T5/T6 are connected in a emitter coupled differential amplifier configuration. Emitter electrodes of transistors T3 and T4 are tied together at one end to form a common node which is connected to a constant current source reference IB3. Collectors of transistors T3 and T4 are loaded by resistors respectively R3 and R4 which are connected to the positive supply voltage VH, through a special circuit 9 comprised of two diodes D1 and D2 connected in series. The role of these diodes which are part of the present invention as to level shifter devices will be explained later on. Emitter electrodes of transistors T5 and T6 are tied all together and connected to a current source reference IB4. Current sources IB3 and IB4 are also physically built with degenerated NFET devices. They are used to prevent the common emitters of T3, T4 and T5, T6 from being pulled up when the column decoder 7 is inactive for a long period of time, leading to possible performance degradation when a given memory cell column has not been activated for a long time. The differential input signal V developed across the bit lines is therefore amplified by two successive differential amplifiers respectively comprised of transistors T3, T4 and T5, T6. Collector electrodes of transistors T5 and T6 are connected to the first data out bus comprised of data lines DLC1 and DLT1 through terminals 10.1 and 10.2 at nodes C and D respectively. For convenience in terminology, the term 'unloaded transistor' will be used to refer to transistors T5 and T6 that do not have a load in the circuit, so that the current passing through the transistor comes from another circuit. Data lines DLC1 and CLT1 also exhibit significant parasitic capacitances due to the connection of a number of memory cell columns. These capacitances are represented by capacitors C3 and C4 respectively. The first stage 4.1 further includes two emitter follower input circuit 11.1 and 11.2. These input circuits 11.1 and 11.2 are coupled between the bit lines BLL and BLR through input terminals 12.1 and 12.2 on the one hand, and the first differential amplifier stage comprised of transistors T3 and T4 on the other hand. These input circuits, which are comprised of transistors T7 and T8, and resistors R5 and R6 respectively, are also part of the present invention. They do not participate in the voltage amplification but are useful in converting voltage levels and as antisaturation device as well.

The second stage bearing numeral 4' essentially consists of a common base amplifier comprised of two NPN transistors T9 and T10. Base electrodes of transistors T9 and T10 are connected to a reference voltage generator 13 through terminal 14 which supplies a reference voltage VREF of a special value as it will be explained later. The first differential output signal V1 produced by first stage 4.1, appears across data lines DLT1 and DLC1 and is inputted to second stage 4' through input terminals 15.1 and 15.2; next, it is applied to the emitter electrodes of transistors T9 and T10. These emitters are also connected to respective constant current sources IB5 and IB6. Collector electrodes of transistors T9 and T10 are connected to the positive voltage VH through resistors R7 and R8. Antisaturation circuits 16.1 and 16.2, each comprised of two diodes in series, D3, D4, and D5, D6 respectively, are connected in parallel with respective resistors R7 and R8. The sense amplifier circuit output signal is available on a second data out bus comprised of data out lines DLC2 and DLT2 through output terminals 17.1 and 17.2. This output signal is supplied to output buffer 5, e.g. a D type flip flop to latch the data. The Data Out signal DO is available at circuit output terminal 18.

Obtaining both a maximum voltage amplification without adverse saturation effects that might have been caused in the absence of SBDs for very high speed operation, implies a very tight cooperation between the first and second stages of sense amplifier 4. The specific means to avoid saturation and help to minimize dotting sensibility will be described in more details below.

CIRCUIT OPERATION

As it has been pointed out previously, the first stage basically comprises two differential amplifier stages, the voltage gain G of which, is maximized for high speed operation, by selecting the appropriate values for resistors R1 to R8 and current sources IB1 to IB6. The first stage is auto-protected against saturation in spite of the fact that the technology used here does not provide SBDs. It must be pointed out that speed (i.e. gain) of that kind of sense amplifier must be checked against saturation because it is not possible to know exactly what will be the differential input voltage V produced across the bit lines during a READ operation, because it is essentially variable. It is therefore necessary that the first differential output signal and the gain must be tuned to avoid reaching output voltage saturation with a very small parasitic input differential offset.

Saturation problems for the first differential amplifier stage, comprised of transistors T3 and T4, are avoided by tuning the voltage across resistors R3 and R4 to be less than VCB(sat). In the worst case, the collector electrode of transistor T3 is tied to a potential of VH-2x VBE-R3xIB1, VBE-R3xIB1, while its base is maintained at VH-2x VBE, one VBE corresponding to the emitter follower input circuit 11.1, and the other to transistor TBLL.

The second differential amplifier stage comprised of transistors T5 and T6, is prevented from saturating with the help of voltage reference generator 13 the output of which is connected to the base electrode of transistors T9 and T10 of the final stage. VREF is designed to be equal to VH-1.5 VBE. This reference voltage generator clamps the data lines DLC1 and DLT1 at VH-2.5 VBE. Due to the action of diodes D1 and D2, the maximum voltage to be applied to the base of either transistor T5 or T6 is clamped at VH-2 VBE. As a result, a 0.5 VBE voltage always exists across the base-collector junctions of transistors T5 and T6 connected to the data lines DLC1 and DLT1, which means that these transistors are always kept far from saturation.

The role of the second or final stage is to substantially decrease the connection capacitance seen by the first stage connection of 32, in the present embodiment). As far as transistors T9 and T10 are concerned, it is apparent from FIG. 1, that in the worst case, the maximum voltage to be applied on the common base of T9 and T10 is VREF, in others words: VH-1.5 VBE. On the other hand, when these transistors are ON the minimum voltage applied to the collector electrodes is VH - 2 VBE as explained above. As a result, a 0.5 VBE is also used here to prevent saturation of transistors T9 and T10. The output swing of the final stage is therefore limited to 2 VBE's under VH. The final stage also provides a high swing signal which is able to drive any type of BICMOS circuit connected to circuit output terminal 18. There is no doubt that this circuit is able to provide smaller output swings, thereby allowing full emitter coupled logic compatibility if necessary. For example, it is always possible to suppress antisaturation circuits 16.1 and 16.2 and to reduce the value of load resistors R7 and R8 in the collectors of transistors T9 and T10.

The common base amplifier based final stage may be implemented in different ways, particularly by the use of Darlington amplifiers, without departing from the scope of the present invention. One skilled in the art has to adopt a different VREF value to still maintain the antisaturation scheme.

FIGS. 2 to 4 show typical signal waveforms which can be useful to those skilled in the art to reduce to practice the sense amplifier of the present invention.

FIG. 2 shows typical differential voltages in the first stage of the double stage sense amplifier of the present invention during a READ operation. Curve 19 shows a first differential voltage across the bases of transistors T3 and T4, in other words VB (T3) − VB (T4). This voltage is approximately identical to the differential input signal V developed between the bit lines BLL and BLR, because emitter follower circuits 11.1 and 11.2 do not provide any voltage gain. Curve 20 shows a second differential voltage between the bases of transistors T5 and T6, in others words VB (T6) − VB (T5), which results from said first differential voltage after amplification in the first differential amplifier stage (T3, T4). Point to 1.40 nsec corresponds to the beginning of a READ operation. FIG. 3 shows similar aspect of the operation of the first stage as far as currents are concerned. Curve 21 shows the differential emitter current between transistors T3 and T4, say IE (T3) − IE (T4), while curve 22 shows the differential emitter current between transistors T5 and T6, say IE (T6) − IE (T5). FIG. 4 shows typical signal wave forms in the second stage of the double stage sense amplifier of the present invention during a READ operation. Curves 23A and 23B respectively show the variations of the potentials on the data lines DLT1 and DLC1. The planarity of curves 23A and 23B, demonstrates that the first differential output signal on the data lines referenced V1 above is quite constant (equal to VH − 2.5 VBE), during the whole READ operation, thereby minimizing the influence of the connections. The capacitances C3 and C4 (what ever their value), which are connected to the data lines DLT1 and DLC1, only slightly affect the potential thereof. Curves 24A and 24B respectively show the potentials on the data out lines DLT2 and DLC2. At last, curves 25A and 25B show the potentials at the base of transistors T5 and T6, respectively. The READ operation may be considered reliable and valid at time t1=2 nsec, so after a delay of t1−t0=0.6 nsec since it was initiated. This clearly demonstrates the high level of performance which is obtained with the double stage sense amplifier of the present invention, when all the bipolar devices are kept far from saturation.

As a result of this particular implementation the circuit is less sensitive to the connections on the DLC1 and DLT1 data lines when compared to the prior art solution as taught in Ref. 1. In the present solution, the voltages of these data lines is quite constant. With a standard BICMOS technology, 1.6 kΩ is a typical value for resistors R3, R4, R5 and R6 while 0.6 kΩ is a typical value for resistors R1 and R2. The value of currents IB3 and IB4 is 1.5 μA, while for IB5 and IB6 it is 30 μA.

The double stage sense amplifier of the present invention can be used in any application involving CMOS SRAM cells where high speed (less than 5 ns) and high density (more than 256 K) are required. Briefly stated, the advantages of the double stage sense amplifier of the present invention are listed thereafter:

very high speed due to very high gain voltage amplification of the differential input signal V produced on the bit lines when a memory cell is read, without the need for SBDs;

saturation prevention with 0.5 VBE clamping across collector-base junction of all transistors;

minimum junction sensitivity to the variations of the first power supply voltage VH, since every node is shifted when the value of the supply voltage VH shifts;

voltage swing signal of 2 VBEs under VH generated at the output of the sense amplifier that is able to correctly drive any BICMOS circuit;

speed protection between two very long periods of inactivity thanks to a special construction of the restore circuit;

adjustable gain in the first stage (where the signal spectrum is low) by selecting appropriate value of resistors and current sources for optimized operation; and, operation on a wide range of temperature and power supplies without any performance degradation.

We claim:

1. A double stage sense amplifier for a computer memory system having a plurality of memory cell columns, each provided with a memory cell array and a pair of bit lines connected to said memory cell array, comprising:

a first sense amplifier means connected between a par of bit lines for operating as a first stage of said double stage sense amplifier;

said first sense amplifier means being of the differential type having input terminals adapted to receive a differential input signal developed across said pair of bit liens and output terminals adapted to transmit a first differential output signal on a pair of intermediate data lines; and a second sense amplifier means for operating as a second stage of said double stage sense amplifier having input terminals adapted to receive the first differential output signal from said intermediate data lines, and output terminals adapted to transmit a second differential output signal on a pair of data out lines to an output buffer in response to said first differential output signal, characterized in that:

said first sense amplifier means includes at least one differential amplifier, said at least one differential amplifier comprising a pair of bipolar transistors, with a final output pair of bipolar transistors of said at least one differential amplifier being first and second unloaded transistors having collectors connected to respective ones of said intermediate data liens, whereby all current passing through said collectors of said final output pair of bipolar transistors comes from respective ones of said intermediate data lines; and said second sense amplifier means includes a common base amplifier means having first and second common base transistors sharing a common base terminal connected to a reference voltage generator that supplies a predetermined reference voltage, first and second common base collector terminals connected to common base bias means, and first and second common base emitter terminals connected to said intermediate data lines, so that a first current path is established from a first voltage terminal through said first common base bias means, said first common base transistor and said first unloaded transistor to a second voltage terminal and a second current path is established through said common base bias means, said second common base transistor and said second unloaded transistor to said second voltage terminal, further characterized in that said final output pair of bipolar transistors have bases maintained by first stage bias means at predetermined output pair base bias values; and said reference voltage generator and said first stage bias means are set such that said final output pair of said at least one differential amplifier have a base-collector voltage less than a predetermined first drive limit, said first drive limit being less than a saturation base-collector voltage, whereby said first stage bias means and said reference voltage generator cooperate to keep said final output pair of bipolar transistors out of saturation.

2. An amplifier according to claim 1, further characterized in that said common base bias means includes first and second saturation limiting means connected in series between a first voltage terminal and corresponding ones of said first and second common base collector terminals; and said predetermined reference voltage and said first and second saturation limiting means are set such that said first and second common base transistors have a base-collector voltage less than a predetermined second drive limit, whereby said reference voltage generator, said first stage bias means, and said first and second saturation limiting means cooperate to keep said first and second common base transistors and said final output pair of bipolar transistors out of saturation.

3. An amplifier according to claim 2, further characterized in that said first and second saturation limiting means limit the voltage on said first and second common base collector terminals to VH - 2VBE and said reference voltage is VH - 1.5 VBE, whereby a 0.5 VBE voltage exists across the base collector junctions of said common base transistors.

4. An amplifier according to claim 2, further characterized in that:

said second drive limit produced by said first and second saturation limiting means and said reference voltage are related such that said intermediate data liens connected to said common base emitter terminals are maintained at a substantially constant voltage during operation of said double stage sense amplifier, whereby such operation is substantially insensitive to the capacitance of said intermediate data lines.

5. An amplifier according to claim 1, further characterized in that:

said first stage bias means limits the maximum voltage applied to said bases of said final output pair of bipolar transistors to VH - 2VBE and said voltage reference generator clamps said intermediate data lines at VH - 2.5VBE, whereby a 0.5VBE voltage exists across the base collector junctions of said final output pair.

6. A double stage sense amplifier for a computer memory system having a plurality of memory cell columns, each provided with a memory cell array and a pair of bit lines connected to said memory cell array, comprising:

a first sense amplifier means connected between a pair of bit lines for operating as a first stage of said double stage sense amplifier;

said first sense amplifier means being of the differential type having input terminals adapted to receive a differential input signal developed across said pair of bit lines and output terminals adapted to transmit a first differential output signal on a pair of intermediate data liens; and a second sense amplifier means for operating as a second stage of said double stage sense amplifier having input terminals adapted to receive the first differential output signal form said intermediate data lines, and output terminals adapted to transmit a second differential output signal on a pair of data out lines to an output buffer in response to said first differential output signal, characterized in that:

said first sense amplifier means includes at least one differential amplifier, said at least one differential amplifier comprising a pair of bipolar transistors, with a final output pair of bipolar transistors of said at lease one differential amplifier being first and second unloaded transistors having collectors connected to respective ones of said intermediate data lines, whereby all current passing through said collectors of said final output pair of bipolar transistors comes from respective ones of said intermediate data liens; and said second sense amplifier means includes a common base amplifier means having first and second common base transistors sharing a common base terminal connected to a reference voltage generator that supplies a predetermined reference voltage, first and second common base collector terminals connected to common base bias means, and first and second common base emitter terminals connected to said intermediate data liens, so that a first current path is established from a first voltage terminal through said first common base bias means, said first common base transistor and said first unloaded transistor to a second voltage terminal and a second current path is established through said common base bias means, said second common base transistor and said second unloaded transistor to said second voltage terminal further characterized in that said first and second common base emitter terminals are connected through corresponding first and second common base current sources to said second voltage reference terminal, whereby a third current path extends parallel to a portion of said first current path from said first common base emitter terminal to said second voltage terminal through said first common base current source and a fourth current path extends parallel to a portion of said second current path from said second common base emitter terminal to said second voltage terminal through said second common base current source, and in that said common base collector terminals are connected to said output terminals.

7. An amplifier according to claim 6, further characterized in that said final output pair of bipolar transistors have emitters connected to an output pair current source means for sinking a predetermined output pair current, whereby said first and second current paths have a combined total current equal to said predetermined output pair current.

* * * * *